(12) United States Patent
Nishikawa et al.

(10) Patent No.: US 11,165,979 B2
(45) Date of Patent: Nov. 2, 2021

(54) IMAGING DEVICE INCLUDING SEMICONDUCTOR SUBSTRATE AND PIXELS

(71) Applicant: Panasonic Intellectual Property Management Co., Ltd., Osaka (JP)

(72) Inventors: Asami Nishikawa, Osaka (JP); Kazuko Nishimura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/986,363

(22) Filed: May 22, 2018

(65) Prior Publication Data

US 2018/0352181 A1    Dec. 6, 2018

(30) Foreign Application Priority Data

Jun. 5, 2017 (JP) .............................. JP2017-111095

(51) Int. Cl.
*H04N 5/3745* (2011.01)
*H04N 5/363* (2011.01)
(Continued)

(52) U.S. Cl.
CPC ........... *H04N 5/363* (2013.01); *H01L 27/307* (2013.01); *H04N 5/2253* (2013.01);
(Continued)

(58) Field of Classification Search
None
See application file for complete search history.

(56) References Cited

U.S. PATENT DOCUMENTS

| 6,781,627 B1* | 8/2004 | Takayanagi | H04N 5/363 |
| | | | 348/301 |
| 2003/0034434 A1* | 2/2003 | Simony | H04N 5/363 |
| | | | 250/208.1 |

(Continued)

FOREIGN PATENT DOCUMENTS

| JP | 2007-226663 | 9/2007 |
| JP | 2009-071057 | 4/2009 |

(Continued)

*Primary Examiner* — Twyler L Haskins
*Assistant Examiner* — Wesley J Chiu
(74) *Attorney, Agent, or Firm* — McDermott Will and Emery LLP

(57) ABSTRACT

An imaging device includes: a semiconductor substrate; pixels arranged two-dimensionally along row and column directions on the substrate; and one or more interconnection layers located on the semiconductor substrate, including a first signal line extending along the column direction and a second signal line to which a multi-level signal is applied. A first pixel includes: a photoelectric converter; a charge storage region; a first interconnection electrically connected to the charge storage region; and a first transistor that includes a first diffusion layer electrically connected to the first signal line and a second diffusion layer electrically connected to the second signal line and that outputs a signal to the first signal line. The first and second signal lines and the first interconnection are arranged in a first interconnection layer. The second signal line is located between the first interconnection and the first signal line, viewed perpendicularly to the substrate.

11 Claims, 10 Drawing Sheets

(51) Int. Cl.
  *H01L 27/30* (2006.01)
  *H04N 5/225* (2006.01)
  *H04N 5/378* (2011.01)
  *H04N 5/359* (2011.01)
  *H04N 5/357* (2011.01)
(52) U.S. Cl.
  CPC ......... *H04N 5/3575* (2013.01); *H04N 5/3595* (2013.01); *H04N 5/378* (2013.01); *H04N 5/3745* (2013.01)

(56) References Cited

U.S. PATENT DOCUMENTS

| | | | |
|---|---|---|---|
| 2003/0214596 A1* | 11/2003 | Simony | H04N 5/363 348/308 |
| 2005/0040320 A1* | 2/2005 | Lule | H01L 27/14609 250/214 R |
| 2008/0135895 A1* | 6/2008 | Lee | H04N 5/363 257/290 |
| 2008/0224243 A1* | 9/2008 | Lee | H01L 27/14636 257/432 |
| 2009/0072122 A1 | 3/2009 | Tada et al. | |
| 2009/0179293 A1 | 7/2009 | Shim et al. | |
| 2013/0113060 A1* | 5/2013 | Matsunaga | H01L 27/14632 257/431 |
| 2014/0043510 A1* | 2/2014 | Kasuga | H01L 27/14643 348/300 |
| 2015/0115339 A1* | 4/2015 | Tamaki | H04N 5/3745 257/292 |
| 2015/0123180 A1* | 5/2015 | Sato | H04N 5/363 257/292 |
| 2016/0049432 A1* | 2/2016 | Otaka | H01L 27/14643 348/308 |
| 2016/0079297 A1* | 3/2016 | Sato | H01L 27/14638 257/291 |

FOREIGN PATENT DOCUMENTS

| | | |
|---|---|---|
| JP | 2009-164604 | 7/2009 |
| JP | 2010-129705 | 6/2010 |
| JP | 2016-127265 | 7/2016 |
| WO | 2014/002361 | 1/2014 |
| WO | 2014/002367 | 1/2014 |

* cited by examiner

IMAGING DEVICE INCLUDING SEMICONDUCTOR SUBSTRATE AND PIXELS

BACKGROUND

1. Technical Field

The present disclosure relates to an imaging device.

2. Description of the Related Art

In recent years, imaging devices (imaging elements) such as video cameras, digital still cameras, monitoring cameras, and vehicle-mounted cameras have been widely used in various fields. As examples of imaging devices, solid state imaging devices of charge coupled device (CCD) type or solid state imaging devices of complementary metal oxide semiconductor (CMOS) type may be enumerated. Especially, the CMOS type solid state imaging devices have been widely used. For the CMOS type solid state imaging devices, which may be produced with use of universal CMOS process, existing facilities may be utilized. Thus there is an advantage in that the imaging devices may be stably supplied. Signals may be read out fast from the CMOS type solid state imaging devices, because peripheral circuits may be mounted in the same chip therein. Thus there is an advantage in that high speeds and high resolutions may be attained.

The image sensors include photodiodes formed on semiconductor substrates. For the CMOS type solid state imaging devices that include photodiodes, correlated double sampling (CDS) technology disclosed in Japanese Unexamined Patent Application Publication No. 2010-129705 is widely utilized, for instance.

On the other hand, a structure in which a photoelectric conversion portion including a photoelectric conversion layer is placed above a semiconductor substrate has been proposed (see Japanese Unexamined Patent Application Publication No. 2009-164604, for instance). Imaging devices having such a structure are referred to as stacked imaging devices. In the stacked imaging devices, charge generated by photoelectric conversion is stored in floating diffusion (FD) that is a charge storage region. A signal in accordance with an amount of the charge stored in the charge storage region is read out through a CCD circuit or a CMOS circuit formed on the semiconductor substrate.

SUMMARY

In a field of imaging devices, reduction of noises and reduction in areas of sensors are demanded.

One non-limiting and exemplary embodiment provides the following imaging device.

In one general aspect, the techniques disclosed here feature an imaging device including: a semiconductor substrate; pixels arranged two-dimensionally along a row direction and a column direction on the semiconductor substrate, the pixels including a first pixel; and one or more interconnection layers located on the semiconductor substrate, the one or more interconnection layers including a first signal line extending along the column direction and a second signal line to which a multi-level signal is applied. The first pixel includes a photoelectric converter that converts incident light into a signal charge, a charge storage region that stores the signal charge, a first interconnection that is electrically connected to the charge storage region, and a first transistor that includes a first diffusion layer and a second diffusion layer, the first diffusion layer being electrically connected to the first signal line, the second diffusion layer being electrically connected to the second signal line, the first transistor outputting a signal corresponding to an amount of the signal charge to the first signal line. The one or more interconnection layers include a first interconnection layer. The first signal line, the second signal line, and the first interconnection are arranged in the first interconnection layer. The second signal line is located between the first interconnection and the first signal line in the first interconnection layer when viewed in a direction perpendicular to the semiconductor substrate.

It should be noted that general or specific embodiments may be implemented as an element, a device, a module, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
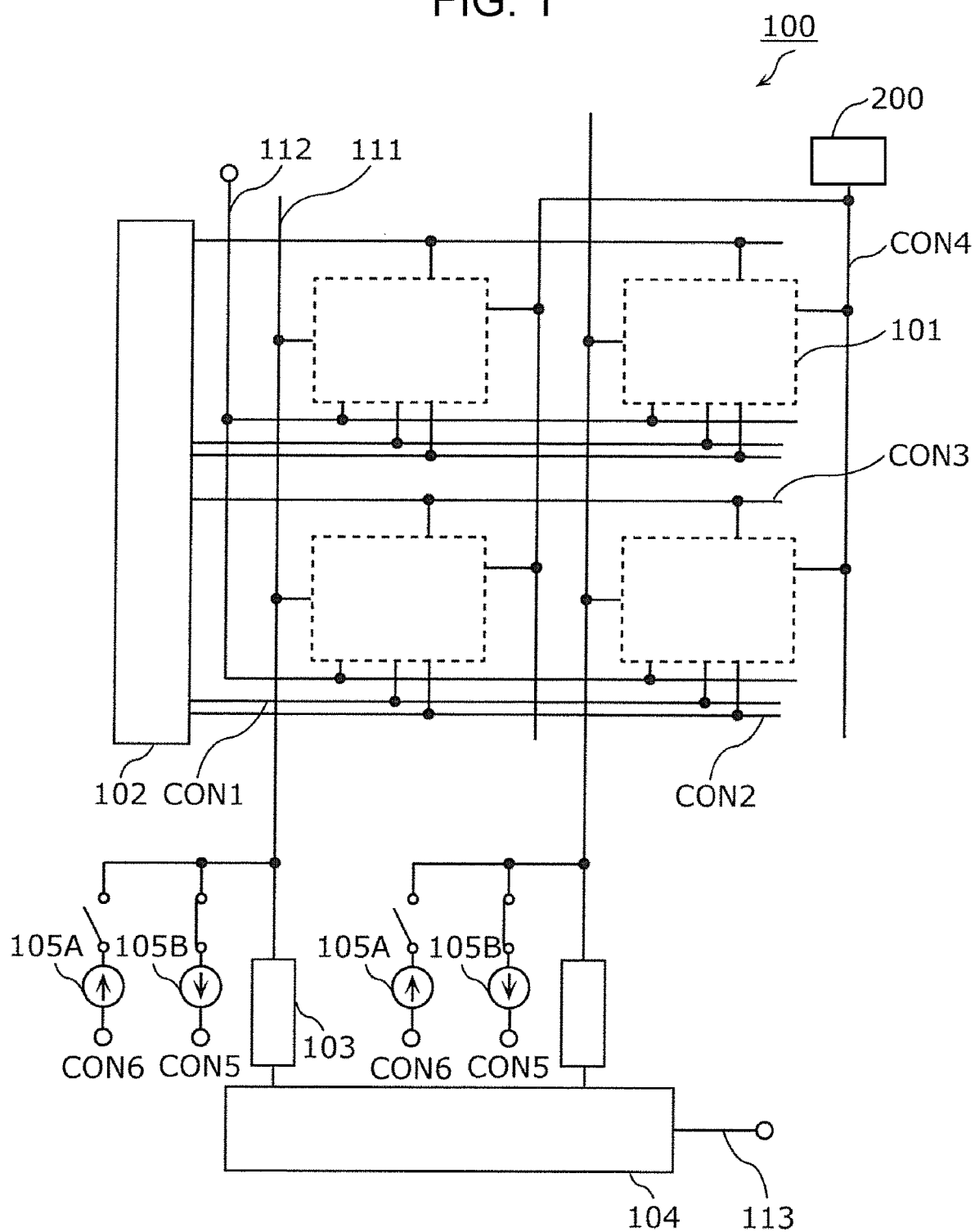
FIG. 1 is a schematic diagram illustrating an exemplary configuration of an imaging device according to an embodiment.

DETAILED DESCRIPTION (Underlying Knowledge Forming Basis of the Present Disclosure)

A problem of increase in influence of kTC noises, which are reset noises generated upon a reset, is caused in case where the correlated double sampling cannot be or is not carried out. In stacked imaging devices, complete transfer of charge is incapable of being attained, in contrast to imaging devices in which pinned photodiodes are used. In the CMOS type solid state imaging devices or the stacked imaging devices in which global shutter operations are carried out, accordingly, the noises are incapable of being sufficiently suppressed only by simple application of the correlated double sampling.

Furthermore, noises that are caused by parasitic capacitance between interconnections cause a problem. In a technique of reducing the noises, a shield wire is provided between the interconnections and one of the interconnections is thereby shielded from the other. Additional provision of the shield wire only for shielding, however, causes a problem of increase in an area of an imaging device.

In the disclosure, an imaging device by which the noises may be reduced while the increase in the area is suppressed will be described.

An imaging device according to one aspect of the disclosure includes: a semiconductor substrate; pixels arranged two-dimensionally along a row direction and a column direction on the semiconductor substrate, the pixels including a first pixel; and one or more interconnection layers located on the semiconductor substrate, the one or more interconnection layers including a first signal line extending along the column direction and a second signal line to which a multi-level signal is applied. The first pixel includes a photoelectric converter that converts incident light into a signal charge, a charge storage region that stores the signal charge, a first interconnection that is electrically connected to the charge storage region, and a first transistor that includes a first diffusion layer and a second diffusion layer, the first diffusion layer being electrically connected to the first signal line, the second diffusion layer being electrically connected to the second signal line, the first transistor outputting a signal corresponding to an amount of the signal charge to the first signal line. The one or more interconnection layers include a first interconnection layer. The first signal line, the second signal line, and the first interconnection are arranged in the first interconnection layer. The second signal line is located between the first interconnection and the first signal line in the first interconnection layer when viewed in a direction perpendicular to the semiconductor substrate.

In this configuration, the second signal line to which the multi-level signal is applied may be used as a shield wire between the first interconnection and the first signal line. Consequently, coupling due to a parasitic capacitance between the charge storage region and the first signal line may be reduced. Thus the imaging device is capable of reducing the noises while suppressing the area increase.

In the imaging device, for instance, the one or more interconnection layers may include a third signal line to which the multi-level signal is applied, the third signal line being arranged in the first interconnection layer, and the first interconnection may be located between the second signal line and the third signal line in the first interconnection layer when viewed in the direction perpendicular to the semiconductor substrate.

In this configuration, both sides of the first interconnection may be shielded with use of the second signal line and the third signal line. Consequently, the noises against the charge storage region may be further reduced.

The third signal line may be electrically connected to the second diffusion layer, for instance.

The pixels may include a second pixel different from the first pixel, and the third signal line may be electrically connected to the second pixel, for instance.

The first pixel may include a feedback path through which the signal is negatively fed back to the charge storage region, for instance.

In this configuration, the noises may be reduced while the area increase is suppressed in the imaging device, which includes the feedback path that may be strongly influenced by the noises due to the coupling with the charge storage region.

The first pixel may include a second transistor that includes the charge storage region and a third diffusion layer, a third transistor that includes a fourth diffusion layer and a fifth diffusion layer, the fourth diffusion layer being electrically connected to the first diffusion layer, the fifth diffusion layer being electrically connected to the third diffusion layer, and a capacitance element that is electrically connected between the charge storage region and the third diffusion layer, and the feedback path may include the charge storage region, the first transistor, the third transistor, and the capacitance element, for instance.

The first pixel may include a fourth transistor that includes a sixth diffusion layer and a seventh diffusion layer, the seventh diffusion layer being electrically connected to the first signal line, a second interconnection that electrically connects the first diffusion layer and the sixth diffusion layer to each other, and a third interconnection that electrically connects the fourth diffusion layer and the sixth diffusion layer to each other, the one or more interconnection layers may include a second interconnection layer, the second signal line, the first interconnection, and at least one of the second interconnection and the third interconnection may be arranged in the second interconnection layer, and the second signal line may be located between the first interconnection and the at least either the second interconnection or the third interconnection in the second interconnection layer when viewed in the direction perpendicular to the semiconductor substrate, for instance.

In this configuration, coupling due to a parasitic capacitance between the charge storage region and the second interconnection or the third interconnection may be reduced.

The second interconnection layer may be different from the first interconnection layer, for instance.

The one or more interconnection layers may include a third interconnection layer adjacent to the first interconnection layer, and each of the first interconnection and the second signal line may be arranged in both the first interconnection layer and the third interconnection layer, for instance.

In this configuration, the second signal line that is used as the shield wire is placed across multiple layers, so that the influence of the noises may be further reduced.

The photoelectric converter may include a first electrode, a second electrode, and a photoelectric conversion film between the first electrode and the second electrode, and the first interconnection may electrically connect the second electrode and the charge storage region to each other, for instance.

In this configuration, the noises may be reduced while the area increase is suppressed in the stacked imaging device, which is strongly influenced by the noises due to the coupling with the charge storage region.

A first voltage may be applied to the second signal line in a reset period in which the charge storage region is reset, and a second voltage different from the first voltage may be applied to the second signal line in a readout period in which the signal is read out from the charge storage region, for instance.

A signal generation circuit that supplies the multi-level signal to the second signal line may be further provided, for instance.

A direction of a current that flows through the second signal line may be changed by application of the multi-level signal, for instance.

It should be noted that general or specific embodiments may be implemented as a system, a method, an integrated circuit, a computer program, a recording medium such as a computer readable CD-ROM, or any selective combination thereof.

Hereinbelow, embodiments of the disclosure will be described with reference to the drawings. The embodiments that will be described below each designate a general or specific example. The disclosure is not limited to the embodiments below. Appropriate modifications may be made unless departing from the scope that ensures achievement of effects of the disclosure. Furthermore, one of the embodiments may be combined with another. In description below, identical or similar components may be designated by the same reference characters and description thereon may be omitted.

In the embodiments that will be described below, transistors in signal readout circuits are NMOS transistors in principle, except some of the transistors. As a matter of course, PMOS transistors may be used as the transistors in the signal readout circuits and then polarities of control signals are reversed. NMOS transistors and PMOS transistors may be used in combination as the transistors in the signal readout circuits.

(First Embodiment)

Hereinbelow, a first embodiment will be described. FIG. 1 is a diagram illustrating a structure of an imaging device 100 according to the embodiment. With reference to FIG. 1, the structure of the imaging device 100 will be described.

The imaging device 100 is a stacked imaging device, as an example, and includes photoelectric conversion film stacked on a semiconductor substrate. The imaging device 100 includes a plurality of pixels 101 and peripheral circuits.

The plurality of pixels 101, arranged two-dimensionally, form a pixel region. The plurality of pixels 101 may be arranged one-dimensionally. The imaging device 100 with such an arrangement is a line sensor.

The pixels 101 are unit pixel cells. In the example illustrated in the drawing, the plurality of pixels 101 are arranged along a row direction and a column direction. In the embodiment, the row direction and the column direction respectively refer to a direction in which rows extend and a direction in which columns extend. That is, a vertical direction is the column direction and a horizontal direction is the row direction.

The imaging device 100 includes a control signal line CON1, a control signal line CON2, and a reset signal line CON3 that are arranged in each row, an output signal line 111, a multi-level signal line CON4, and a storage control line 112 that are arranged in each column.

Each of the pixels 101 is connected to the output signal line 111 placed in a corresponding column. To the pixels 101, control signals are supplied through the control signal lines CON1, the control signal lines CON2, the reset signal lines CON3, and the multi-level signal line CON4. Detailed description on the pixels 101 will be given later.

The peripheral circuits include a vertical scanning circuit 102, column signal processing circuits 103, a horizontal signal readout circuit 104, constant current sources 105A, and constant current sources 105B. The vertical scanning circuit 102, the column signal processing circuits 103, and the horizontal signal readout circuit 104 may also be respectively referred to as a row scanning circuit, row signal storage circuits, and a column scanning circuit.

The column signal processing circuit 103, the constant current source 105A, and the constant current source 105b are provided in each column of the pixels 101 arranged two-dimensionally, for instance.

An example of configurations of the peripheral circuits will be described below. The vertical scanning circuit 102 is connected to the control signal lines CON1, the control signal lines CON2, and the reset signal lines CON3. The vertical scanning circuit 102 selects a plurality of pixels 101 arranged in each row, row by row, by applying a specified voltage to the control signal line CON1. Then readout of signal voltages from the selected pixels 101 and resets of pixel electrodes that will be described later are carried out.

The pixels 101 placed in each column are electrically connected to the column signal processing circuit 103 through the output signal line 111 corresponding to the column. The column signal processing circuit 103 carries out noise suppression signal processing typified by the correlated double sampling, analog-digital conversion, which may be referred to as AD conversion, or the like. The horizontal signal readout circuit 104 is electrically connected to the plurality of column signal processing circuits 103 provided corresponding to the plurality of columns. The horizontal signal readout circuit 104 sequentially reads out signals, outputted from the plurality of column signal processing circuits 103, into a horizontal signal common line 113.

Multi-level signal is applied to the multi-level signal line CON4. Herein, the multi-level signal means a signal of which voltage changes among a plurality of different voltages. The multi-level signal is generated by a signal generation circuit 200 connected to the multi-level signal line CON4, for instance. The signal generation circuit 200 may be provided in the imaging device 100 or may be provided out of the imaging device 100.

Figure 2:
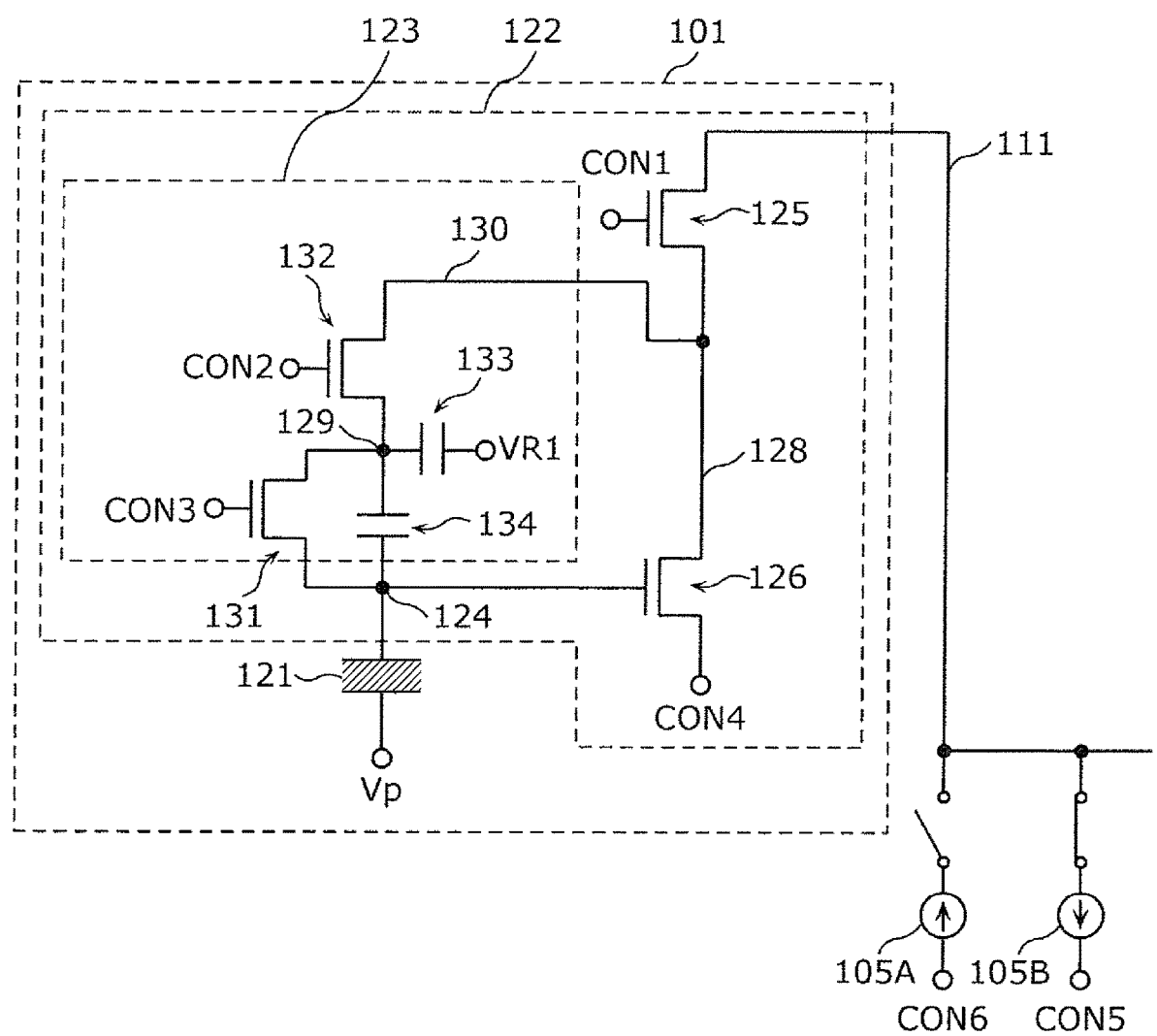
FIG. 2 is a schematic diagram illustrating an exemplary circuit configuration of a pixel according to the embodiment.

FIG. 2 is a circuit diagram illustrating an exemplary configuration of the pixel 101 in the imaging device 100 according to the embodiment. The pixel 101 includes a photoelectric converter 121 and a readout circuit 122.

The photoelectric converter 121 is a photodetector and converts incident light that is an optical signal into a signal charge that is an electric signal. The readout circuit 122 reads out the electric signal converted by the photoelectric converter 121.

The readout circuit 122 includes a bandwidth controller 123, a charge storage region 124, a selecting transistor (fourth transistor) 125, and an amplifying transistor (first transistor) 126. The charge storage region 124 is a portion of a node in which the signal charge detected by the photoelectric converter 121 is stored. The charge storage region 124 is referred to as floating diffusion (FD) as well.

The photoelectric converter 121 includes the first electrode, the second electrode, and the photoelectric conversion film, for instance. The photoelectric conversion film is located between the first electrode and the second electrode. The photoelectric conversion film is an organic photoelectric conversion film, for instance. A reference voltage Vp is applied to the first electrode. One end of the node that forms the charge storage region 124 is connected to the second electrode. Thus the signal charge generated by the photoelectric converter 121 is stored in the charge storage region 124.

A method of storing the signal charge in the charge storage region 124 with use of the photoelectric converter 121 including the photoelectric conversion film will be described specifically. Upon incidence of light on the photoelectric conversion film, electron-hole pairs are generated by photoelectric conversion. When there is a potential difference between the first electrode and the second electrode, either of the electrons and the holes that have been generated move to the second electrode. When the reference voltage Vp applied to the first electrode is higher than a voltage (such as a reset voltage) of the second electrode, for instance, the holes move to the second electrode. The holes move to the charge storage region 124 through interconnections. Thus the holes may be used as the signal charge. The electrons may be used as the signal charge.

Figure 3:
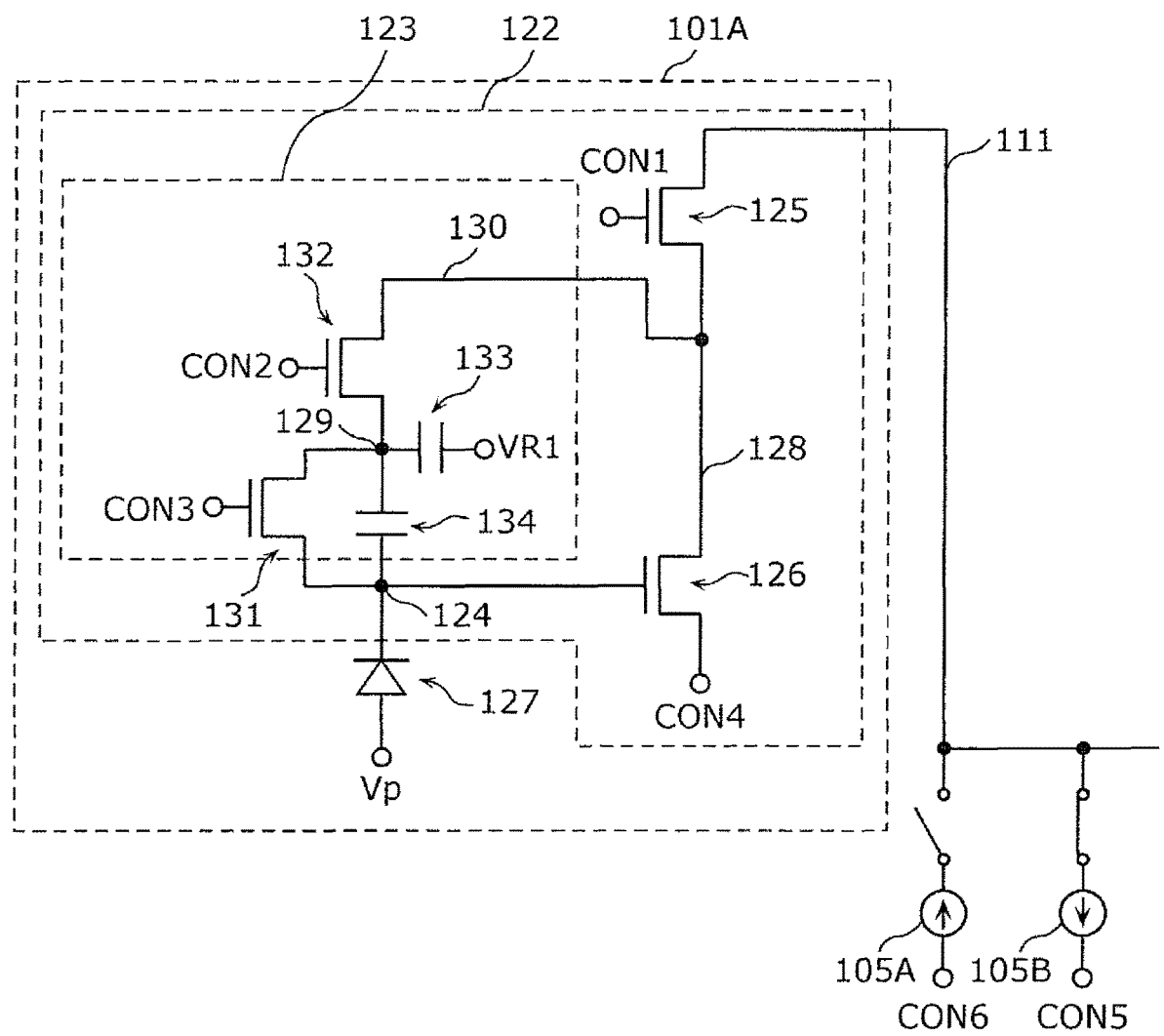
FIG. 3 is a schematic diagram illustrating an exemplary circuit configuration of a pixel according to the embodiment.

A broad variety of elements that have a photoelectric conversion function may be used as the photoelectric converter 121. As another example, a photodiode 127 may be used as the photoelectric converter 121, as in a pixel 101A illustrated in FIG. 3. A ground potential or the reference voltage Vp is applied to one end of the photodiode 127. The one end of the node that forms the charge storage region 124 is connected to the other end of the photodiode 127. Thus a signal charge generated by the photodiode 127 is stored in the charge storage region 124. In the example in which the photodiode 127 is used as the photoelectric converter 121, a transfer transistor may be provided between the photodiode 127 and the charge storage region 124. In this configuration, the signal charge converted by the photodiode 127 is transferred to the charge storage region 124 through the transfer transistor.

FIG. 2 is referred to again. The charge storage region 124 is connected to the photoelectric converter 121 through an interconnection layer. The charge storage region 124 is connected to a gate of the amplifying transistor 126. The amplifying transistor 126 outputs a signal, corresponding to an amount of the signal charge stored in the charge storage region 124, to the bandwidth controller 123 and the selecting transistor 125.

The bandwidth controller 123 includes a reset transistor (second transistor) 131 for resetting the charge storage region 124, a bandwidth control transistor (third transistor) 132 for limiting a bandwidth of a feedback signal which is fed back from the charge storage region 124 through the amplifying transistor 126, a capacitance element 133 (first capacitance element), and a capacitance element 134 (second capacitance element).

The charge in the charge storage region 124 is reset by the reset transistor 131. In a "noise suppression period" that will be described later, the signal read out from the charge storage region 124 is amplified by the amplifying transistor 126, is band-limited by the bandwidth control transistor 132, and is thereafter fed back to the charge storage region 124.

That is, the readout circuit 122 includes a feedback path through which the signal outputted from the amplifying transistor 126 and corresponding to the amount of the signal charge is negatively fed back to the charge storage region 124. The feedback path includes the charge storage region 124, the amplifying transistor 126, the bandwidth control transistor 132, and the capacitance element 134.

The selecting transistor 125 is connected to the output signal line 111 that is shared among at least two pixels. The pixels that share the output signal line 111 may belong to the same column. Provision of one output signal line 111 for each column is not requisite. For instance, one output signal line 111 may be provided for and shared among a plurality of columns. Alternatively, a plurality of output signal lines 111 may be provided for one column. For instance, a first output signal line and a second output signal line may be provided for one column so that signals from pixels located in odd-numbered rows may be outputted to the first output signal line and so that signals from pixels located in even-numbered rows may be outputted to the second output signal line. In a "readout period" and "reset readout period" that will be described later, the signal amplified by the amplifying transistor 126 is outputted to the output signal line 111 through the selecting transistor 125. In this period, the feedback path is not formed.

Herein, the "capacitance element" means a structure in which a dielectric such as an insulating film is interposed between electrodes. The "electrode" is not limited to an electrode formed of metal and is interpreted so as to broadly encompass a polysilicon layer or the like. The "electrode" herein may be a portion of the semiconductor substrate.

Figure 4:
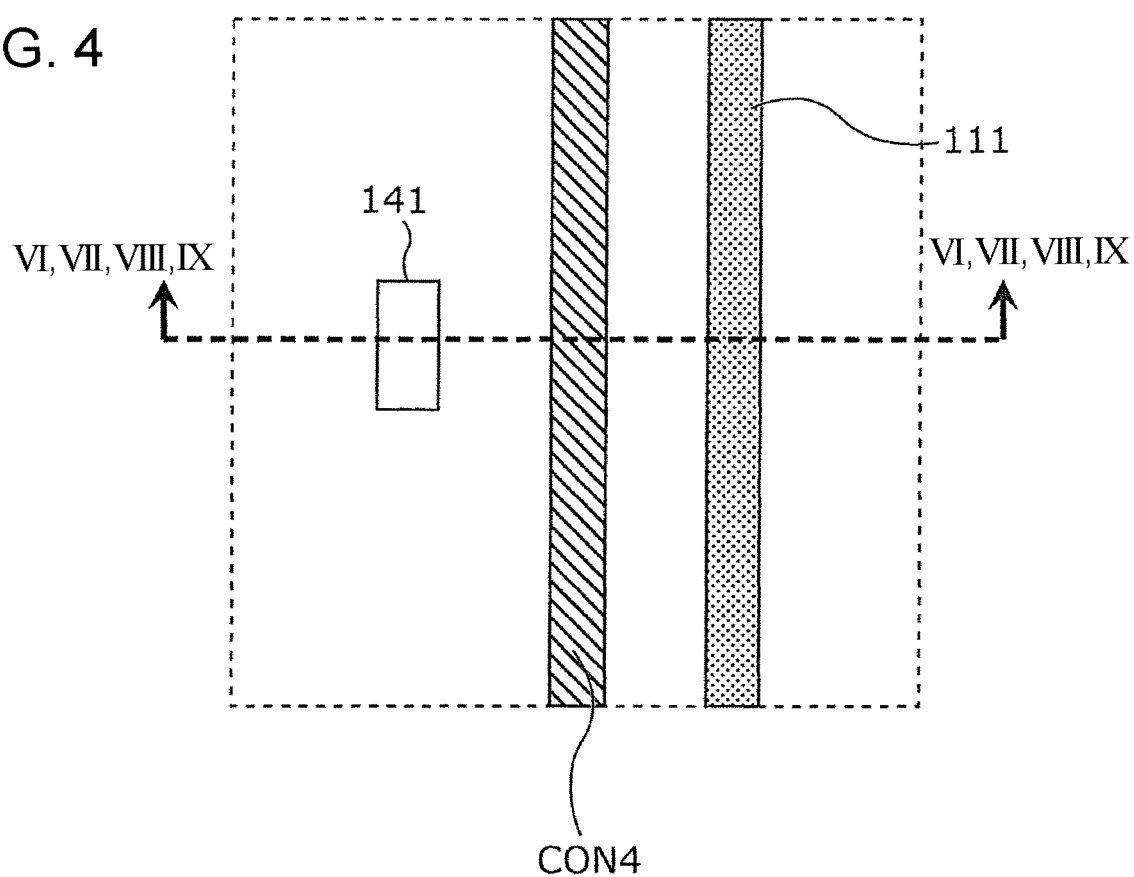
FIG. 4 is a plan view schematically illustrating an example of a layout of elements in the pixel according to the embodiment.

FIG. 4 is a plan view schematically illustrating an example of a layout of the charge storage region 124, the output signal line 111, and the multi-level signal line CON4 in the pixel 101.

In a configuration exemplified in FIG. 4, the multi-level signal line CON4 is located in a position that is adjacent to an FD interconnection 141 (first interconnection) which is an interconnection connected to the charge storage region 124 and that is adjacent to the output signal line 111. Specifically, the multi-level signal line CON4 is located between the FD interconnection 141 and the output signal line 111 in plan view, that is, when viewed in a direction perpendicular to the semiconductor substrate. The output signal line 111 and the multi-level signal line CON4 extend in the column direction.

The multi-level signal line CON4 may be a signal line that is used commonly for all the pixels, as illustrated in FIG. 1. In this configuration, the multi-level signal line CON4 includes at least interconnection portions that extend in the column direction. For instance, the multi-level signal line CON4 includes a plurality of interconnection portions that extend in the column direction in the pixel region and each column is provided with the corresponding interconnection portion. The plurality of interconnection portions are electrically connected to one another out of or in a periphery of the pixel region.

There is a possibility that a parasitic capacitance caused by the FD interconnection 141 and the output signal line 111 may influence circuit operations in the "noise suppression period" which will be described later and in which noises are reduced. The configuration exemplified in FIG. 4 makes it possible to use the multi-level signal line CON4 as a shield wire. Thus capacitance coupling due to the parasitic capacitance may be suppressed without provision of a new shield wire.

Figure 5:
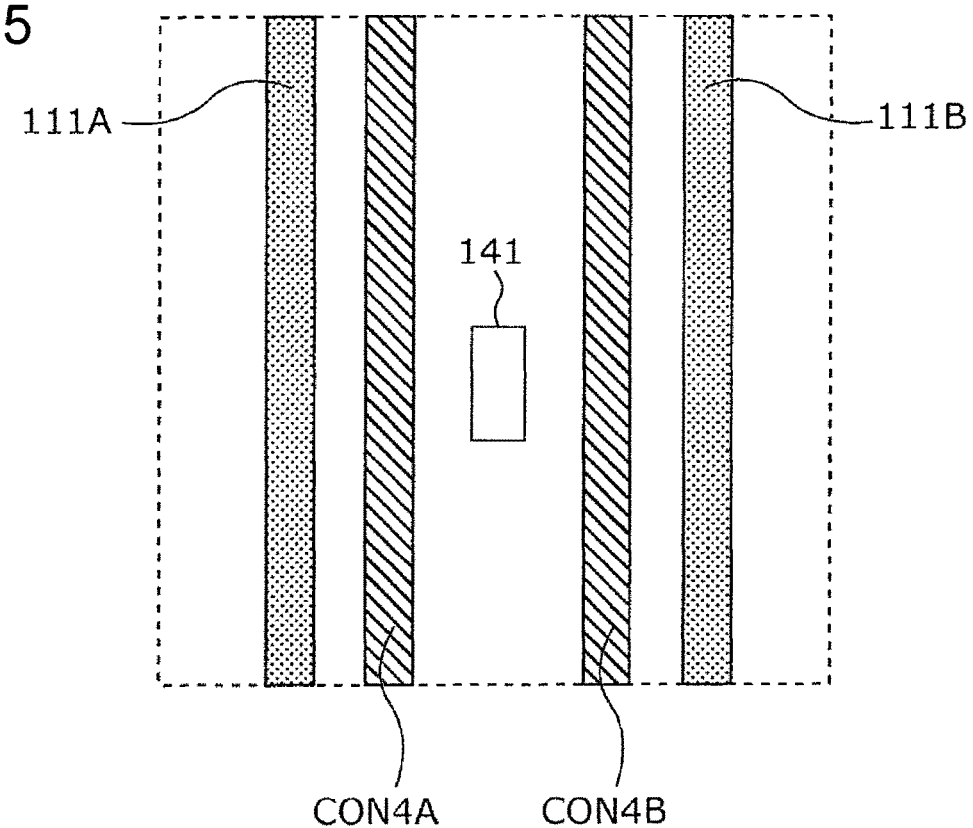
FIG. 5 is a plan view schematically illustrating another example of a layout of elements in the pixel according to the embodiment.

A configuration exemplified in FIG. 5 may be used as another example. In the example illustrated in FIG. 5, the FD interconnection 141 is located between a set of multi-level signal lines CON4A and CON4B. That is, the FD interconnection 141 is located between the multi-level signal line CON4A (second signal line) and the multi-level signal line CON4B (third signal line), when viewed in a direction perpendicular to the photoelectric converter 121. The multi-level signal line CON4A is located between the FD interconnection 141 and an output signal line 111A when viewed in the direction perpendicular to the photoelectric converter 121. The multi-level signal line CON4B is located between the FD interconnection 141 and an output signal line 111B when viewed in the direction perpendicular to the photoelectric converter 121.

The output signal line 111A and the output signal line 111B are the output signal lines 111 arranged in adjoining columns, for instance. The multi-level signal line CON4A and the multi-level signal line CON4B are the multi-level signal lines CON4 arranged in the same column. That is, the multi-level signal line CON4A and the multi-level signal line CON4B are electrically connected to each other in the pixel region. In other words, the multi-level signal line CON4A and the multi-level signal line CON4B are connected to the same pixel 101. Specifically, the multi-level signal line CON4A and the multi-level signal line CON4B are electrically connected to one of a source and a drain of the amplifying transistor 126 included in a pixel 101.

The multi-level signal line CON4A and the multi-level signal line CON4B do not have to be electrically connected at least in the pixel region. In other words, the multi-level signal line CON4A and the multi-level signal line CON4B may be connected to different pixels 101. Specifically, the multi-level signal line CON4A and the multi-level signal line CON4B may be electrically connected to either sources or drains of the amplifying transistors 126 included in the different pixels 101, respectively. The multi-level signal line CON4A and the multi-level signal line CON4B may be the multi-level signal lines CON4 provided in different columns, for instance. Alternatively, a plurality of multi-level signal lines CON4 may be provided for each column. For instance, pixels 101 that vertically adjoin in the same column may be respectively connected to different multi-level signal lines CON4 among the plurality of multi-level signal lines CON4 provided in the column. In such a configuration, the multi-level signal lines CON4A and CON4B are included in the plurality of multi-level signal lines CON4 provided for a column.

The configuration illustrated in FIG. 5 may enable more effective shielding among the interconnections. Thus the capacitance coupling may be suppressed more effectively.

Figure 6:
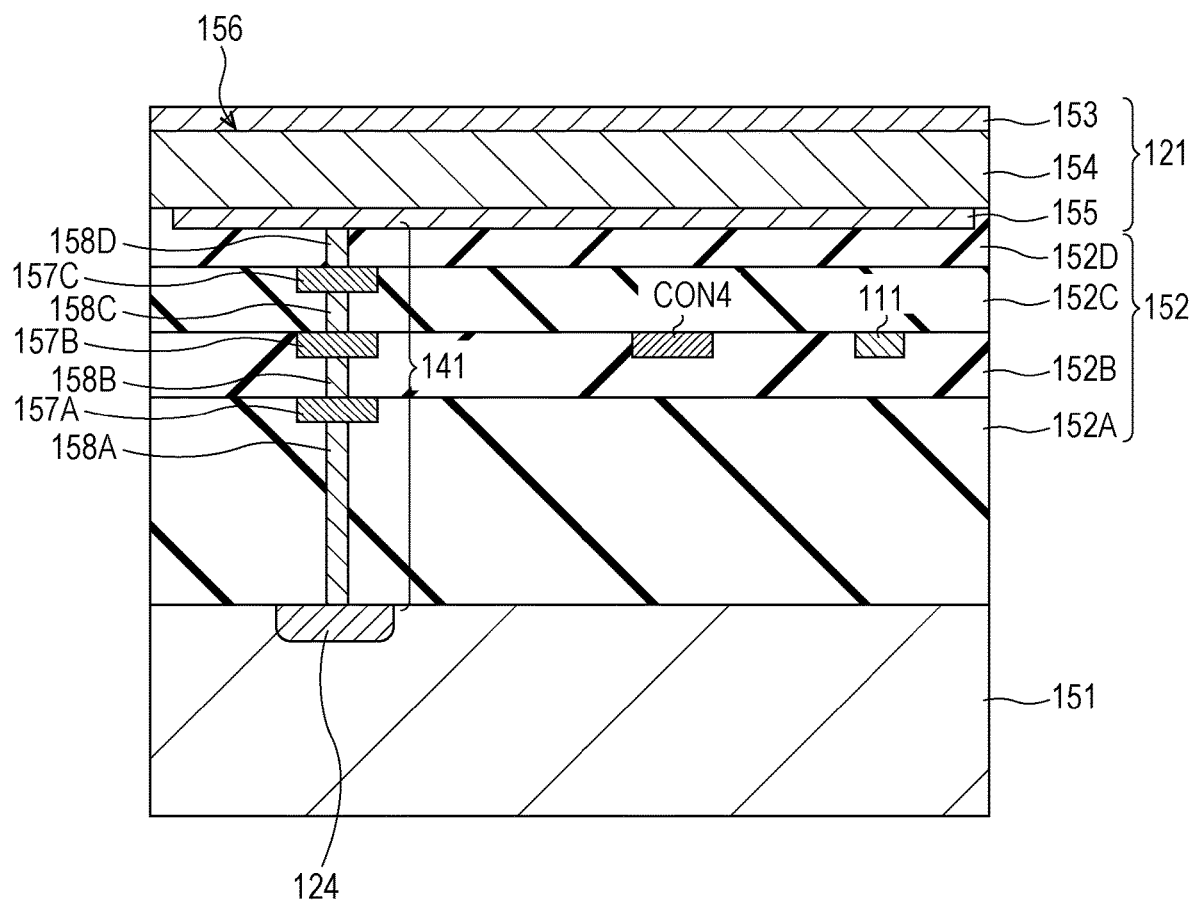
FIG. 6 is a sectional view schematically illustrating an example of a section of the pixel according to the embodiment.

FIG. 6 is a sectional view schematically illustrating a section taken along a line VI-VI illustrated in FIG. 4. The pixels 101 are arranged on a semiconductor substrate 151. Herein, an example in which a p-type silicon (Si) substrate is used as the semiconductor substrate 151 will be described.

The photoelectric converter 121 is formed over the semiconductor substrate 151. In the example illustrated in the drawing, interlayer dielectric layers 152 are formed on the semiconductor substrate 151. The interlayer dielectric layers 152 include interlayer dielectric layers 152A, 152B, 152C, and 152D. The photoelectric converter 121 is formed on the interlayer dielectric layers 152.

The photoelectric converter 121 includes a first electrode 153, a photoelectric conversion film 154, and a second electrode 155. The first electrode 153 is provided on a light receiving surface 156 of the photoelectric conversion film 154 that is a surface on a side on which light from a subject is incident. The second electrode 155 is provided on a surface opposed to the light receiving surface 156. The second electrodes 155 of the plurality of pixels 101 are electrically separated from one another.

The amplifying transistor 126 is formed on the semiconductor substrate 151 (not illustrated in FIG. 6). The FD interconnection 141 includes interconnections 157A to 157C and vias 158A to 158D that are formed in the interlayer dielectric layers 152. The interconnections 157A to 157C are formed in different interconnection layers.

As illustrated in FIG. 6, the output signal line 111, the multi-level signal line CON4, and the interconnection 157B that is at least a portion of the FD interconnection 141 are placed in the same interconnection layer. The multi-level signal line CON4 is placed between the output signal line 111 and the interconnection 157B. Thus the capacitance coupling due to the parasitic capacitance caused by the FD interconnection 141 and the output signal line 111 may be suppressed.

Figure 7:
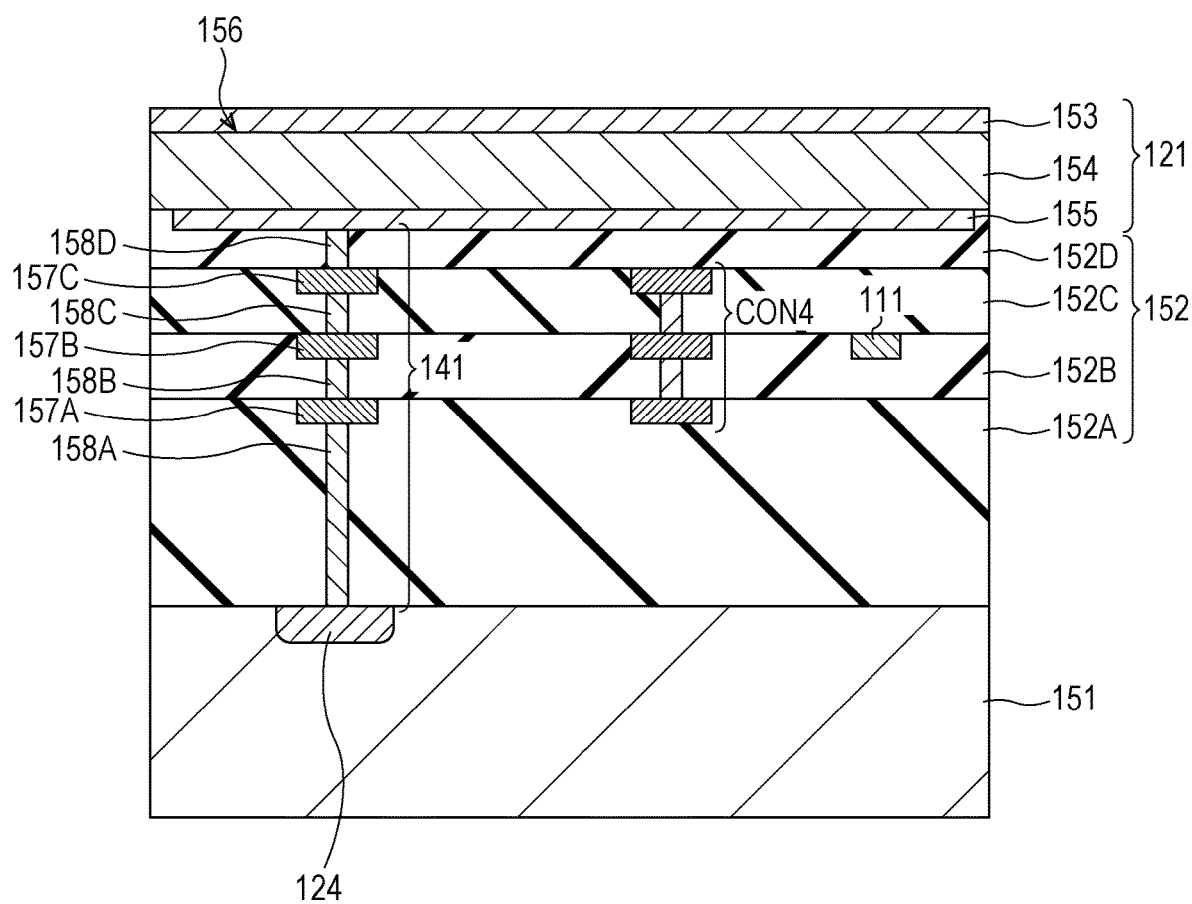
FIG. 7 is a sectional view schematically illustrating another example of a section of the pixel according to the embodiment.

FIG. 7 is a sectional view schematically illustrating a modification of a section taken along the line VII-VII illustrated in FIG. 4. In an example illustrated in FIG. 7, the multi-level signal line CON4 is multi-layered. That is, a portion of the FD interconnection 141 and the multi-level signal line CON4 are placed so as to span a plurality of interconnection layers. Though FIG. 7 illustrates the example in which the multi-level signal line CON4 is formed so as to span three layers, the multi-level signal line CON4 has only to be provided so as to span the plurality of interconnection layers. In this configuration, the capacitance coupling between the interconnection 157C, which is located in the interconnection layer different from the output signal line 111, and the output signal line 111 may be suppressed. Thus the capacitance coupling due to the parasitic capacitance caused by the FD interconnection 141 and the output signal line 111 may be further suppressed.

Figure 8:
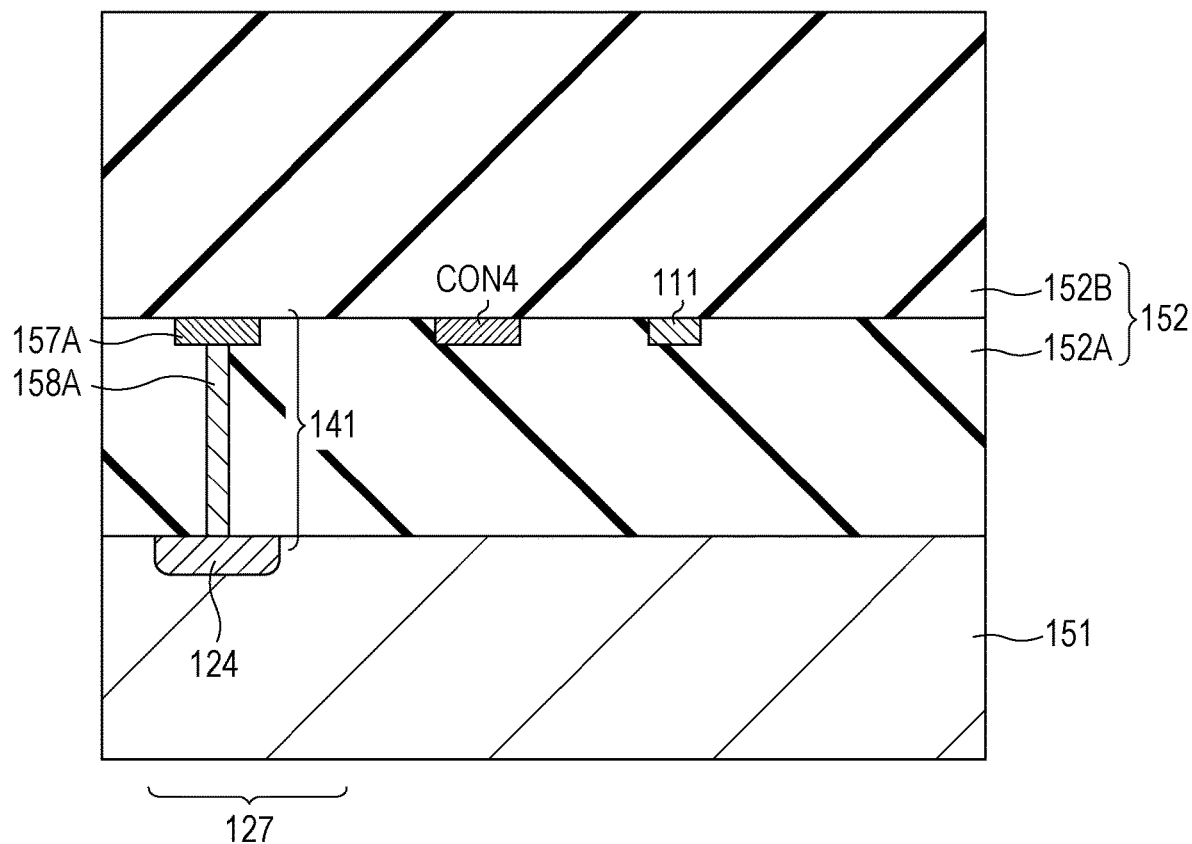
FIG. 8 is a sectional view schematically illustrating another example of a section of the pixel according to the embodiment.
Figure 9:
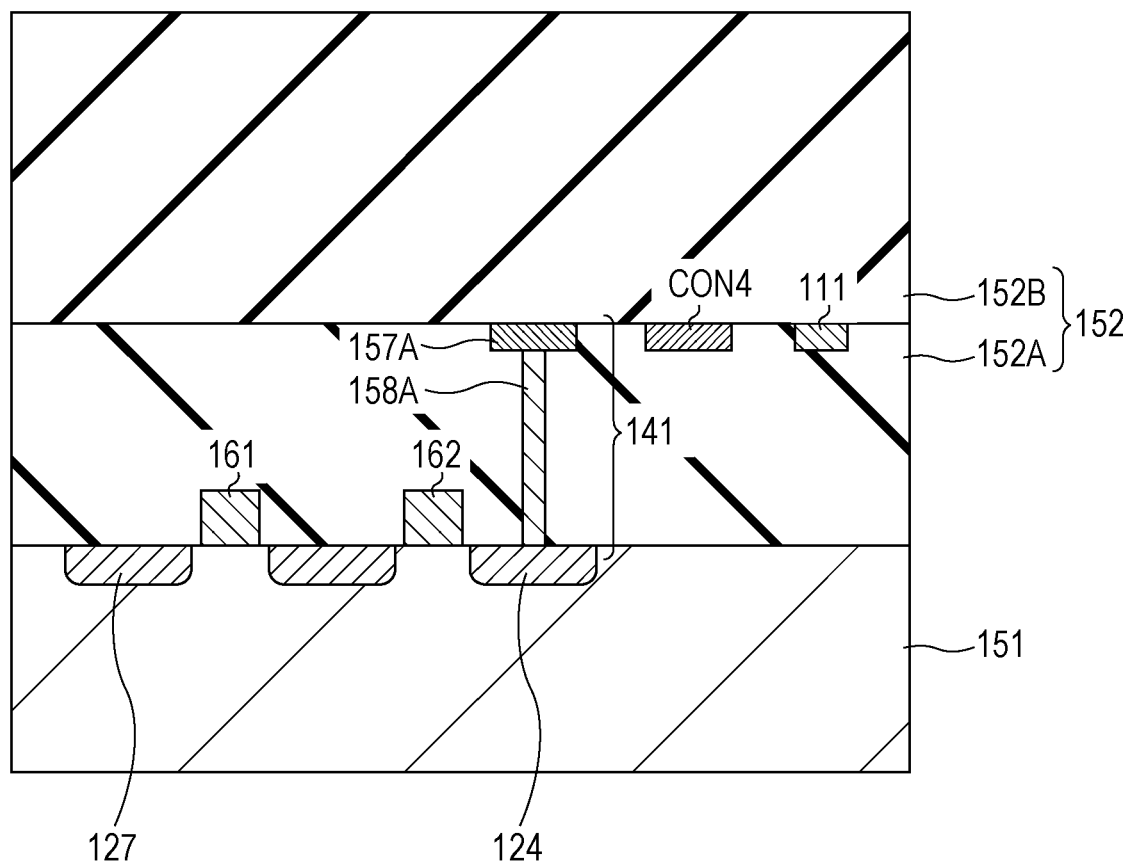
FIG. 9 is a sectional view schematically illustrating another example of a section of the pixel according to the embodiment.

FIGS. 8 and 9 are sectional views taken along the line VIII, IX-VIII, IX illustrated in FIG. 4 in examples in which the photodiode 127 is used as the photoelectric converter 121. In FIG. 8, the photodiode 127 is formed of the charge storage region 124 and the semiconductor substrate 151. In this example as well, as illustrated in FIG. 8, the output signal line 111, the multi-level signal line CON4, and the interconnection 157A that is at least a portion of the FD interconnection 141 are placed in the same interconnection layer. The multi-level signal line CON4 is placed between the output signal line 111 and the interconnection 157A. Thus the capacitance coupling due to the parasitic capacitance caused by the FD interconnection 141 and the output signal line 111 may be suppressed.

FIG. 9 is the sectional view taken along the line IX-IX illustrated in FIG. 4 in the example in which the photodiode 127 is used as the photoelectric converter 121 and in which transfer transistors are used. In the example illustrated in FIG. 9, the photodiode 127 and the charge storage region 124 are electrically connected to each other through the transfer transistors 161 and 162. Though FIG. 9 illustrates a form in which the two transfer transistors are used, only one transfer transistor may be used or three or more transfer transistors may be used.

Hereinbelow, relation of electrical connection in the readout circuit 122 will be described. A drain and a source of a transistor are determined based on an applied voltage, strictly, and may be impossible to distinguish structurally. In relation to the embodiment, therefore, the drain and the source will be described as one and the other of the drain and the source. For convenience, a lower terminal in FIG. 2 is designated as one of the drain and the source and an upper terminal is designated as the other of the drain and the source. The drain and the source are each formed of a diffusion layer.

As illustrated in FIG. 2, the charge storage region 124 is connected to the gate of the amplifying transistor 126. The other of the drain and the source of the amplifying transistor 126 is connected to the other of the drain and the source of the bandwidth control transistor 132 and to the one of the drain and the source of the selecting transistor 125. The one of the drain and the source of the bandwidth control transistor 132 is connected to one end of the capacitance element 133. A reference voltage VR1 is applied to the other end of the capacitance element 133. Thus an RC filter circuit is formed of the bandwidth control transistor 132 and the capacitance element 133.

The one of the drain and the source of the bandwidth control transistor 132 is further connected to one end of the capacitance element 134. The other end of the capacitance element 134 is connected to the charge storage region 124.

The control signal line CON2 is connected to a gate of the bandwidth control transistor 132. On and off of the bandwidth control transistor 132 is determined in accordance with a voltage of the control signal line CON2. When the voltage of the control signal line CON2 is at a high level, for instance, the bandwidth control transistor 132 is turned on. As a result, the feedback path is formed of the charge storage region 124, the amplifying transistor 126, the bandwidth control transistor 132, and the capacitance element 134.

When the voltage of the control signal line CON2 is lowered, a resistance component of the bandwidth control transistor 132 increases. Accordingly, a band of the bandwidth control transistor 132 and a frequency domain of the signal that is fed back are narrowed.

When the feedback path is formed, a signal outputted from the bandwidth control transistor 132 is attenuated in an attenuation circuit formed based on a parasitic capacitance of the capacitance element 134 and the charge storage region 124 and the attenuated signal is fed back to the charge storage region 124. An attenuation rate B is expressed as Cc/(Cc+Cfd) where Cc is a capacitance of the capacitance element 134 and Cfd is the parasitic capacitance of the charge storage region 124.

When the voltage of the control signal line CON2 is further lowered to a low level, the bandwidth control transistor 132 is turned off and the feedback path is not formed.

The charge storage region 124 is further connected to one of a drain and a source of the reset transistor 131. The one of the drain and the source of the reset transistor 131 may function as the charge storage region 124. That is, the one of the drain and the source of the reset transistor 131 may be the charge storage region 124.

The other of the drain and the source of the reset transistor 131 is connected to a node 129. The reset signal line CON3 is connected to a gate of the reset transistor 131. A state of the reset transistor 131 is determined in accordance with a voltage of the reset signal line CON3. When the voltage of the reset signal line CON3 is at a high level, for instance, the reset transistor 131 is turned on. Thus the charge storage region 124 is reset at a voltage of the node 129.

The other of the source and the drain of the selecting transistor 125 is connected to the output signal line 111. A gate of the selecting transistor 125 is connected to the control signal line CON1. On and off of the selecting transistor 125 is determined in accordance with a voltage of the control signal line CON1. When the voltage of the control signal line CON1 is at the high level, for instance, the selecting transistor 125 is turned on. Thus the amplifying transistor 126 and the output signal line 111 are electrically connected to each other. When the voltage of the control signal line CON1 is at the low level, the selecting transistor 125 is turned off. Consequently, the selecting transistor 125 and the output signal line 111 are electrically separated from each other.

The multi-level signal line CON4 is connected to one of the drain and the source of the amplifying transistor 126. In the reset period in which the charge storage region 124 is reset, a voltage VA1 is applied from the multi-level signal line CON4 to the one of the drain and the source of the amplifying transistor 126. In the readout period in which the charge is read out from the charge storage region 124, a voltage VA2 is applied from the multi-level signal line CON4 to the one of the drain and the source of the amplifying transistor 126.

By control over a voltage applied to the multi-level signal line CON4, the voltage applied to the one of the drain and the source of the amplifying transistor 126 is switched to the voltage VA1 or the voltage VA2. The voltage VA1 is GND and the voltage VA2 is VDD, for instance. An amplification circuit that includes the multi-level signal line CON4 and the amplifying transistor 126 may be provided for each pixel or may be shared among a plurality of pixels. The number of elements per pixel may be reduced by sharing of the amplification circuit among the plurality of pixels.

The constant current sources 105A and 105B are connected to the output signal line 111. When the selecting transistor 125 is in on state, a source follower circuit is formed of the selecting transistor 125, the amplifying transistor 126, and the constant current source 105A or 105B. The signal corresponding to the signal charge stored in the charge storage region 124 is outputted to the output signal line 111 and is read out to outside. Specifically, in the reset period and the noise suppression period that will be described later, the constant current source 105A is connected to the output signal line 111. In the readout period and the reset readout period, the constant current source 105B is connected to the output signal line 111.

Figure 10:
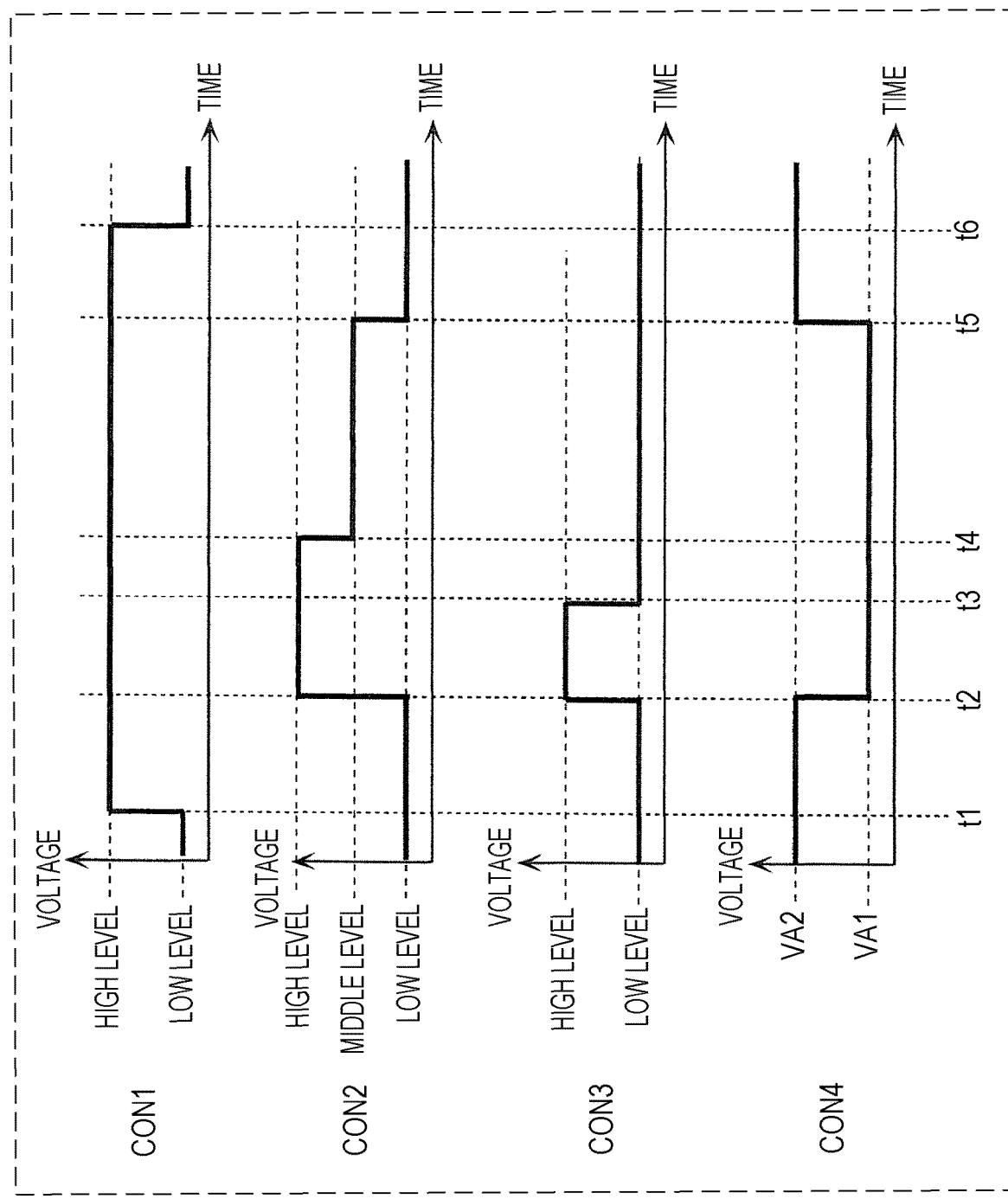
FIG. 10 is a timing diagram for illustration of an example of operations of a readout circuit according to the embodiment.

Subsequently, operations of the readout circuit 122 will be described. FIG. 10 is a timing diagram illustrating an example of the operations of the readout circuit 122. In graphs therein, horizontal axes designate time and vertical axes respectively designate the voltage level of the control signal line CON1, the voltage level of the control signal line CON2, the voltage level of the reset signal line CON3, and the voltage level of the multi-level signal line CON4, in descending order.

(Exposure/Readout Period)

In a period precedent to time t1, the selecting transistor 125 is in off state because the voltage of the control signal line CON1 is at the low level. In the period, a signal charge generated in accordance with the incident light is stored in the charge storage region 124. At the time t1, the voltage of the control signal line CON1 is turned into the high level, so that the selecting transistor 125 is turned on. Then the voltage level of the multi-level signal line CON4 is as high as the voltage VA2 (such as VDD). In this state, the amplifying transistor 126 and the constant current source 105B form the source follower circuit. Thus the signal corresponding to the signal charge stored in the charge storage region 124 is outputted to the output signal line 111. Then an amplification factor of the source follower circuit is about one time, for instance.

(Reset Period)

At time t2, the voltage of the control signal line CON2 is turned into the high level, so that the bandwidth control transistor 132 is turned on. Then the voltage level of the multi-level signal line CON4 changes into the voltage VA1 (such as GND), so that the voltage VA1 is applied to the one of the drain and the source of the amplifying transistor 126. Furthermore, the voltage of the reset signal line CON3 is turned into the high level, so that the reset transistor 131 is turned on. Thus the voltage of the charge storage region 124 is reset at a reference voltage VR2.

At time t3, the voltage of the reset signal line CON3 is turned into the low level, so that the reset transistor 131 is turned off. Then the readout circuit 122 forms the feedback path with an amplification factor of −A×B. Thus a kTC noise of the charge storage region 124 at time when the reset transistor 131 is turned off is suppressed to $1/(1+A\times B)$ times. The noise may be rapidly suppressed by setting of the voltage of the control signal line CON2 such that an operating band of the bandwidth control transistor 132 may be a first band that is a wide band.

(Noise Suppression Period)

In a period from time t4 to time t5, the voltage of the control signal line CON2 is set at a voltage midway between the high level and the low level. As a result, the operating band of the bandwidth control transistor 132 turns into a second band that is narrower than the first band.

A noise suppressing effect is increased by lowering of the second band. On the other hand, time duration from the time t4 to the time t5 is thereby prolonged. A designer may arbitrarily design the second band in accordance with time that is allowable as the time duration from the time t4 to the time t5. Hereinbelow, the second band will be treated as a band that is sufficiently lower than an operating band of the amplifying transistor 126. The noise suppressing effect may be obtained even though the second band is higher than the operating band of the amplifying transistor 126.

In a state in which the second band is lower than the operating band of the amplifying transistor 126, a thermal noise generated in the bandwidth control transistor 132 is suppressed to $1/(1+A\times B)^{1/2}$ times. At time t5, in this state, the voltage of the control signal line CON2 is turned into the low level, so that the bandwidth control transistor 132 is turned off. The kTC noise that remains in the charge storage region 124 at time when the bandwidth control transistor 132 is turned off has a value of sum of squares of the kTC noise caused by the reset transistor 131 and a kTC noise caused by the bandwidth control transistor 132.

A capacitance of the capacitance element 133 is denoted by Cs. The kTC noise of the bandwidth control transistor 132 that is generated in a state without suppression by the feedback is $(Cfd/Cs)^{1/2}$ times the kTC noise of the reset transistor 131 that is generated in the state without the suppression by the feedback. In consideration of this point, the kTC noise with the feedback is suppressed to $[\{1+(1+A\times B)\times Cfd/Cs\}/(1+A\times B)]^{1/2}$ times that without the feedback.

(Reset Readout Period)

At time t5, the voltage level of the multi-level signal line CON4 turns into the voltage VA2 (e.g. VDD). Thus the voltage VA2 is applied to the one of the drain and the source of the amplifying transistor 126. In this state, the amplifying transistor 126 and the constant current source 105B form the source follower circuit. Thus a signal corresponding to the reset voltage (VR2) is outputted to the output signal line 111. In a circuit in a downstream stage, for instance, the correlated double sampling processing is carried out in which a difference between the signal read out in the reset readout period and the signal read out in the readout period is calculated. The obtained difference is outputted as a pixel signal to the outside of the imaging device 100.

A random noise herein means a fluctuation in output at time when the electric signal converted by the photoelectric converter 121 is zero, that is, the kTC noise. In the noise suppression period, the kTC noise is suppressed to $[\{1+(1+A\times B)\times Cfd/Cs\}/(1+A\times B)]^{1/2}$ times. As a result, satisfactory image data having the random noise suppressed may be obtained.

It is desirable for the capacitance Cs of the capacitance element 133 to be greater than the capacitance Cc of the capacitance element 134. Normally, increase in the capacitance of the charge storage region 124 causes decrease in the random noise. When the charge signal is converted into the voltage signal in the charge storage region 124, however, the signal is thereby weakened. As a result, S/N is not improved only by the mere increase in the capacitance of the charge storage region 124. In the embodiment, the capacitance element 133 is connected to the charge storage region 124 and separation between the charge storage region 124 and the node 129 is effected by the capacitance element 134. Therefore, the signal in the charge storage region 124 resists being reduced even in case where the capacitance of the capacitance element 133 is increased. As a result, the random noise may be effectively suppressed while reduction in the signal is suppressed. Accordingly, the S/N may be improved effectively.

In the embodiment, the signal in the charge storage region 124 is read out by the source follower circuit in the readout period and then the amplification factor is on the order of one time. Without limitation thereto, however, a designer may alter the amplification factor in accordance with the S/N or a circuit range that are required for a system.

According to the embodiment, the feedback for noise cancellation is carried out in each pixel. Thus influence due to a time constant of the output signal line 111 may be reduced in comparison with a case with the feedback through the output signal line 111, for instance. Thus the noise cancellation may be carried out rapidly. Moreover, a greater noise suppressing effect may be obtained by increase in the capacitances of the capacitance elements provided in the pixels 101.

When the parasitic capacitance exists between the charge storage region 124 and the output signal line 111, a signal, that is, a noise amplified by a factor of a capacitance division ratio between the capacitance in the charge storage region 124 and the parasitic capacitance between the charge storage region 124 and the output signal line 111, is superimposed on the charge storage region 124 during or after an operation of the noise cancellation. That is, provided that the capacitance in the charge storage region 124 is denoted by C1 and that the parasitic capacitance between the charge storage region 124 and the output signal line 111 is denoted by C2, the noise amplified by $C1/(C1+C2)$ is superimposed on the charge storage region 124. It is thus made difficult to obtain a desired noise suppressing effect. In the embodiment, by contrast, shielding from the parasitic capacitance between the charge storage region 124 and the output signal line 111 is attained with use of the multi-level signal line CON4. Though the voltages that may have two or more values are applied to the multi-level signal line CON4, the voltage of the multi-level signal line CON4 is fixed at the voltage VA1 or VA2 in each of the noise suppression period, the readout period, and the reset readout period. Thus influence of change in the voltage of the multi-level signal line CON4 on the operation of the noise cancellation and the operation of the readout is prevented. In other words, voltage fluctuation that may be caused by the multi-level signal line CON4 does not occur on the output signal line 111 during the operation of the noise cancellation and the operation of the readout. Thus the multi-level signal line CON4 may be used as the shield wire. Furthermore, use of the multi-level signal line CON4 as the shield wire obviates necessity to provide a new shield wire and suppresses the area increase.

In the solid state imaging device 100 according to the embodiment, the parasitic capacitance coupling thus may be reduced under a condition with use of a small number of interconnections. As a result, both noise reduction and area reduction may be attained.

Though the example in which the multi-level signal line CON4 is placed between the FD interconnection 141 and the output signal line 111 has been described above, the multi-level signal line CON4 may be placed between the FD interconnection 141 and at least one of an interconnection 128 (second interconnection), which connects the amplifying transistor 126 and the selecting transistor 125 to each other, and an interconnection 130 (third interconnection), which connects the selecting transistor 125 and the bandwidth control transistor 132 to each other.

Figure 11:
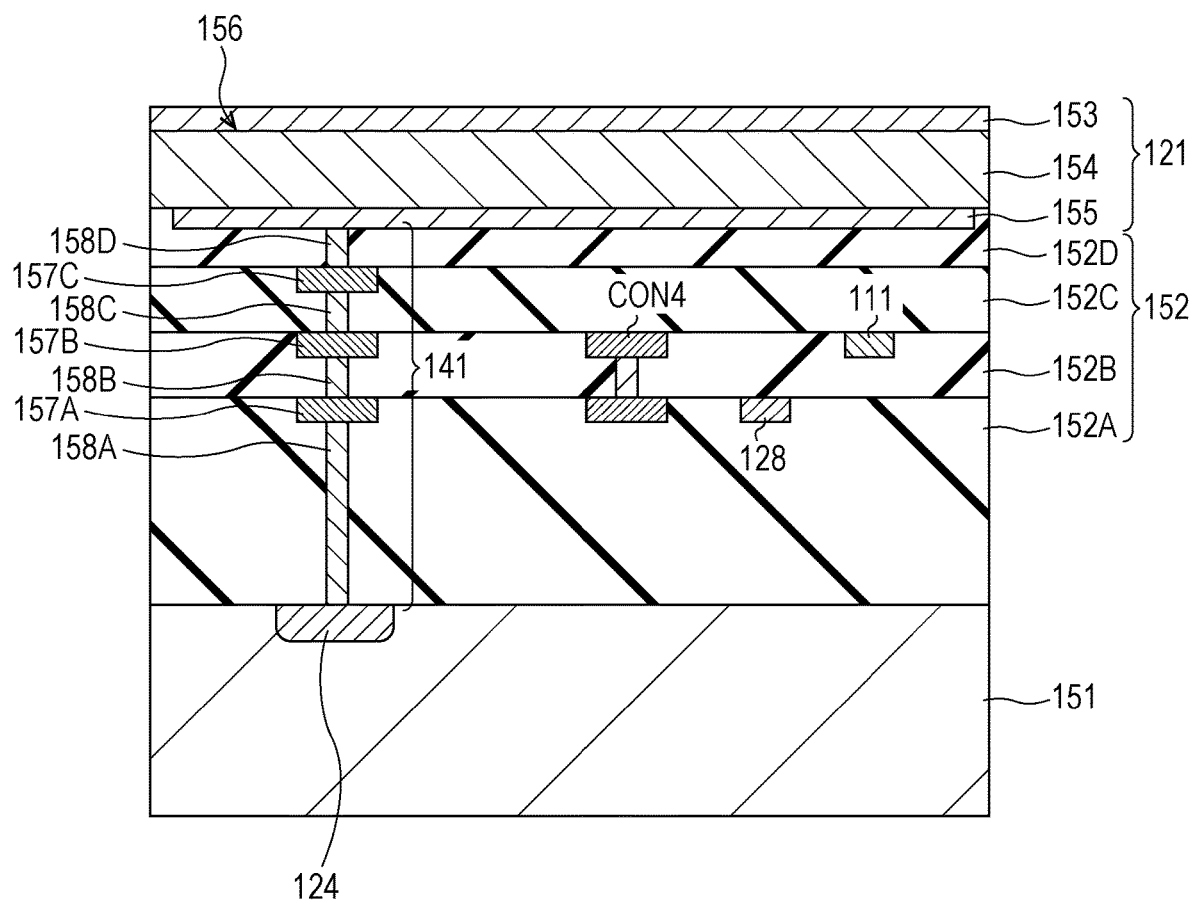
FIG. 11 is a sectional view schematically illustrating another example of a section of the pixel according to the embodiment.

FIG. 11 is a sectional view illustrating a section of an above configuration. As illustrated in FIG. 11, the interconnection 128, a portion of the multi-level signal line CON4, and the interconnection 157A that is the portion of the FD interconnection 141 are formed in the same interconnection layer. The portion of the multi-level signal line CON4 is located between the interconnection 157A and the interconnection 128 when viewed in the direction perpendicular to the semiconductor substrate 151. Thus the capacitance coupling due to the parasitic capacitance between the interconnection 128 and the FD interconnection 141 may be suppressed.

A positional relationship between the output signal line 111 and the interconnection 128 that is illustrated in FIG. 11 is an example and there is no limitation thereto. For instance, the output signal line 111 and the interconnection 128 may be formed in the same interconnection layer. A similar placement may be used for the interconnection 130. That is, a portion of the multi-level signal line CON4, a portion of the FD interconnection 141, and the output signal line 111 may be placed in a first interconnection layer and another portion of the multi-level signal line CON4, another portion of the FD interconnection 141, and a portion of the interconnection 128 or the interconnection 130 may be placed in a second interconnection layer that is the same as or different from the first interconnection layer.

As described above, the imaging device 100 includes the semiconductor substrate 151, the plurality of pixels 101 arranged in matrix on the semiconductor substrate 151, the plurality of output signal lines 111 (first signal lines) provided column by column, and the multi-level signal line CON4 (second signal line) to which the multi-level signal is applied. The plurality of pixels 101 include a first pixel. The first pixel includes the photoelectric converter 121 that converts the incident light into the charge, the charge storage region 124 that stores the charge, the FD interconnection 141 (first interconnection) that is electrically connected to the charge storage region 124, and the amplifying transistor 126 (first transistor). The amplifying transistor 126 includes the other (first diffusion layer) of the drain and the source and the one (second diffusion layer) of the drain and the source. The amplifying transistor 126 outputs the signal corresponding to the amount of the charge to the output signal line 111. The other of the drain and the source is electrically connected to the corresponding output signal line 111. The one of the drain and the source is electrically connected to the multi-level signal line CON4. As illustrated in FIG. 6, the FD interconnection 141, the output signal line 111, and the multi-level signal line CON4 are arranged in the first interconnection layer. As illustrated in FIG. 4, the multi-level signal line CON4 is located between the FD interconnection 141 and the output signal line 111 when viewed in the direction perpendicular to the semiconductor substrate 151.

In this configuration, the multi-level signal line CON4 to which the multi-level signal is applied may be used as the shield wire between the FD interconnection 141 and the output signal line 111. Consequently, the coupling due to the parasitic capacitance between the charge storage region 124 and the output signal line 111 may be reduced. Thus the noises may be reduced while the area increase is suppressed in the imaging device 100.

As illustrated in FIG. 5, the imaging device 100 further includes the multi-level signal line CON4B to which the multi-level signal is applied and which is placed in the first interconnection layer. The FD interconnection 141 is located between the multi-level signal line CON4A and the multi-level signal line CON4B when viewed in the direction perpendicular to the semiconductor substrate 151.

In this configuration, both the sides of the FD interconnection 141 may be shielded with use of the multi-level signal line CON4A and the multi-level signal line CON4B. Consequently, the noises against the charge storage region 124 may be further reduced.

The multi-level signal line CON4B is electrically connected to the one of the drain and the source of the amplifying transistor 126 of the first pixel, for instance. The plurality of pixels 101 include a second pixel that is different from the first pixel, for instance. The multi-level signal line CON4B is electrically connected to the one of the drain and the source of the amplifying transistor 126 of the second pixel.

As illustrated in FIG. 2, the first pixel includes the feedback path through which the signal is negatively fed back to the charge storage region 124. In this configuration, in the imaging device 100, which includes the feedback path that may be strongly influenced by the noises due to the coupling with the charge storage region 124, the noises may be reduced while the area increase is suppressed.

As illustrated in FIG. 2, the first pixel includes the reset transistor 131 (second transistor) that includes the charge storage region 124 and the other (third diffusion layer) of the drain and the source, the bandwidth control transistor 132 (third transistor) that includes the other (fourth diffusion layer) of the drain and the source and the one (fifth diffusion layer) of the drain and the source, and the capacitance element 134 that is electrically connected between the charge storage region 124 and the other of the drain and the source of the reset transistor 131. The other of the drain and the source of the bandwidth control transistor 132 is electrically connected to the other of the drain and the source of the amplifying transistor 126. The one of the drain and the source of the bandwidth control transistor 132 is electrically connected to the other of the drain and the source of the reset transistor 131. The feedback path includes the charge storage region 124, the amplifying transistor 126, the bandwidth control transistor 132, and the capacitance element 134.

As illustrated in FIG. 2, the first pixel includes the selecting transistor 125 (fourth transistor) that includes the one (sixth diffusion layer) of the drain and the source and the other (seventh diffusion layer) of the drain and the source, the interconnection 128 (second interconnection) that electrically connects the other of the drain and the source of the amplifying transistor 126 and the one of the drain and the source of the selecting transistor 125, and the interconnection 130 (third interconnection) that electrically connects the other of the drain and the source of the bandwidth control transistor 132 and the one of the drain and the source of the selecting transistor 125. The other of the drain and the source of the selecting transistor 125 is electrically connected to the output signal line 111. The multi-level signal line CON4, the FD interconnection 141, and at least either of the interconnection 128 and the interconnection 130 are arranged in the second interconnection layer. The second interconnection layer is the same as or different from the first interconnection layer, for instance. The multi-level signal line CON4 is located between the FD interconnection 141 and at least either of the interconnection 128 and the interconnection 130 when viewed in the direction perpendicular to the semiconductor substrate 151.

In this configuration, the coupling due to the parasitic capacitance between the charge storage region 124 and the interconnection 128 or the interconnection 130 may be reduced.

As illustrated in FIG. 7, the FD interconnection 141 and the multi-level signal line CON4 are arranged in the first interconnection layer and a third interconnection layer that is adjacent to the first interconnection layer.

In this configuration, the multi-level signal line CON4 that is used as the shield wire is placed across multiple layers. As a result, the influence of the noises may be further reduced.

As illustrated in FIG. 6, the photoelectric converter 121 includes the photoelectric conversion film 154. The FD interconnection 141 electrically connects the second electrode 155 of the photoelectric converter 121 and the charge storage region 124 to each other.

In this configuration, in the stacked imaging device 100 that may be strongly influenced by the noises due to the coupling with the charge storage region 124, the noises may be reduced while the area increase is suppressed.

As illustrated in FIG. 10, the first voltage VA1 is applied to the multi-level signal line CON4 in the reset period in which the charge storage region 124 is reset and the second voltage VA2 different from the first voltage VA1 is applied to the multi-level signal line CON4 in the readout period in which the charge is read out from the charge storage region 124. Then a direction of a current that flows through the multi-level signal line CON4 may be changed.

Though the imaging device according to the embodiment has been described above, the disclosure is not limited to the embodiment.

For instance, division into functional blocks in block diagrams is an example. Implementation of a plurality of functional blocks as one functional block, division of one functional block into a plurality of functional blocks, or transfer of some functions to other functional blocks may be carried out.

Processing units included in the imaging device according to the above embodiment are typically implemented as LSIs that are integrated circuits. The LSIs may be separately provided as single chips, or some or all of the LSIs may be integrated on a single chip.

Formation of the integrated circuits may be achieved by use of dedicated circuits or general-purpose processors without limitation to LSIs. Field programmable gate arrays (FPGAs) that are programmable after manufacture of the LSIs or reconfigurable processors in which connections or settings of circuit cells is reconfigurable inside the LSI, may be used.

In the above embodiment, some of components may be implemented by execution of software programs suitable for the components. The components may be implemented by readout and execution of software programs, recorded in a recording medium such as a hard disk or a semiconductor memory, by a program execution unit such as a CPU or a processor.

Though the imaging device in accordance with the one or the plurality of aspects has been described above based on the embodiment, the disclosure is not limited to the embodiment. The embodiment for which modifications conceivable by those skilled in the art are provided and forms constructed by combining components of different embodiments may be included within the scope of the one or the plurality of aspects, unless departing from the purport of the disclosure.

The imaging device in accordance with the disclosure may be applied to various camera systems and sensor systems such as digital still cameras, monitoring cameras, vehicle-mounted cameras, digital single-lens reflex camera, and digital mirrorless single-lens reflex cameras.

What is claimed is:

1. An imaging device comprising:
a semiconductor substrate;
pixels arranged two-dimensionally along a row direction and a column direction on the semiconductor substrate, the pixels including a first pixel; and
one or more interconnection layers located on the semiconductor substrate, the one or more interconnection layers including a first signal line extending along the column direction and a second signal line to which a multi-level signal is applied, wherein
the first pixel includes
a photoelectric converter that converts incident light into a signal charge,
a charge storage region that stores the signal charge,
a first interconnection that is electrically connected to the charge storage region, and
a first transistor that includes a first diffusion layer and a second diffusion layer, the first diffusion layer being electrically connected to the first signal line not through the second diffusion layer, the second diffusion layer being electrically connected to the second signal line, the first transistor outputting a signal corresponding to an amount of the signal charge to the first signal line,
the one or more interconnection layers include a first interconnection layer,
the first signal line, the second signal line, and the first interconnection are arranged in the first interconnection layer,
the second signal line is located between the first interconnection and the first signal line in the first interconnection layer when viewed in a direction perpendicular to the semiconductor substrate,
the first pixel includes a feedback path through which the signal is negatively fed back to the charge storage region,
the first pixel further includes
a second transistor that includes the charge storage region and a third diffusion layer,
a third transistor that includes a fourth diffusion layer and a fifth diffusion layer, the fourth diffusion layer being electrically connected to the first diffusion layer not through either the second diffusion layer or a gate of the first transistor, the fifth diffusion layer being electrically connected to the third diffusion layer, and
a capacitance element that is electrically connected between the charge storage region and the third diffusion layer, and
the feedback path includes the charge storage region, the first transistor, the third transistor, and the capacitance element.

2. The imaging device according to claim 1, wherein
the one or more interconnection layers include a third signal line to which the multi-level signal is applied, the third signal line being arranged in the first interconnection layer, and
the first interconnection is located between the second signal line and the third signal line in the first interconnection layer when viewed in the direction perpendicular to the semiconductor substrate.

3. The imaging device according to claim 2, wherein the third signal line is electrically connected to the second diffusion layer.

4. The imaging device according to claim 2, wherein
the pixels include a second pixel different from the first pixel, and
the third signal line is electrically connected to the second pixel.

5. The imaging device according to claim 1, wherein
the first pixel includes
- a fourth transistor that includes a sixth diffusion layer and a seventh diffusion layer, the seventh diffusion layer being electrically connected to the first signal line,
- a second interconnection that electrically connects the first diffusion layer and the sixth diffusion layer to each other, and
- a third interconnection that electrically connects the fourth diffusion layer and the sixth diffusion layer to each other, the one or more interconnection layers include a second interconnection layer,
the second signal line, the first interconnection, and at least one of the second interconnection and the third interconnection are arranged in the second interconnection layer, and
the second signal line is located between the first interconnection and the at least either the second interconnection or the third interconnection in the second interconnection layer when viewed in the direction perpendicular to the semiconductor substrate.

6. The imaging device according to claim 5, wherein the second interconnection layer is different from the first interconnection layer.

7. The imaging device according to claim 1, wherein
the one or more interconnection layers include a second interconnection layer adjacent to the first interconnection layer, and
each of the first interconnection and the second signal line are arranged in both the first interconnection layer and the second interconnection layer.

8. The imaging device according to claim 1, wherein
the photoelectric converter includes a first electrode, a second electrode, and a photoelectric conversion film between the first electrode and the second electrode, and
the first interconnection electrically connects the second electrode and the charge storage region to each other.

9. The imaging device according to claim 1, wherein
a first voltage is applied to the second signal line in a reset period in which the charge storage region is reset, and
a second voltage different from the first voltage is applied to the second signal line in a readout period in which the signal is read out from the charge storage region.

10. The imaging device according to claim 1, further comprising:
a signal generation circuit that supplies the multi-level signal to the second signal line.

11. The imaging device according to claim 1, wherein a direction of a current that flows through the second signal line is changed by application of the multi-level signal.

* * * * *